US009369112B2

(12) United States Patent
Bianchi (10) Patent No.: US 9,369,112 B2
(45) Date of Patent: Jun. 14, 2016

(54) VARIABLE ATTENUATOR (71) Applicant: Giovanni Bianchi, Nufringen (DE)

(72) Inventor: Giovanni Bianchi, Nufringen (DE)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/557,440

(22) Filed: Dec. 1, 2014

(65) Prior Publication Data
US 2015/0084681 A1 Mar. 26, 2015

Related U.S. Application Data (63) Continuation of application No. PCT/EP2012/060263, filed on May 31, 2012.

(51) Int. Cl.
*H03L 5/00* (2006.01)
*H03H 11/24* (2006.01)
*B32B 27/32* (2006.01)
*H03K 5/08* (2006.01)

(52) U.S. Cl.
CPC .............. *H03H 11/245* (2013.01); *B32B 27/32* (2013.01); *H03K 5/08* (2013.01)

(58) Field of Classification Search
CPC ............................... H03H 11/245; H03K 3/08
USPC ................... 327/306, 308; 333/81 R
See application file for complete search history.

(56) References Cited

U.S. PATENT DOCUMENTS

| 5,309,048 | A  | * | 5/1994 | Khabbaz ........................ 327/310 |
| 6,400,222 | B1 | * | 6/2002 | Takahashi ..................... 330/149 |
| 6,737,933 | B2 | * | 5/2004 | Nyberg ........................ 333/81 R |
| 7,505,748 | B2 | * | 3/2009 | McCarthy et al. .......... 455/249.1 |
| 7,679,417 | B2 | * | 3/2010 | Vice ................................ 327/308 |
| 2003/0132814 | A1 | | 7/2003 | Nyberg |
| 2005/0001685 | A1 | | 1/2005 | Nakayama et al. |
| 2007/0139119 | A1 | | 6/2007 | Kojima |

FOREIGN PATENT DOCUMENTS

| JP | H9-46176 A | 2/1997 |
| JP | 2000-101381 | 4/2000 |
| JP | 2002-252550 | 9/2002 |

OTHER PUBLICATIONS

Hakan Dogan et al., Analysis and Design of RF CMOS Attenuators, IEEE Journal of Solid State Circuits, vol. 43, No. 10, Oct. 2008, pp. 2269-2283.
Hakan Dogan et al., Intermodulation Distortion in CMOS Attenuators and Switches, IEEE Journal of Solid State Circuits, vol. 42, No. 3, Mar. 2007, pp. 529-539.
Sorrentino, R. et al., Microwave and RF Engineering, John Wiley and Sons, Ltd., 2010, pp. 190-192 and 389-400.
Horng, J. S. et al., A 2-20 GHz MESFET Variable Attenuator Using a Single Positive External Drive Voltage, 19th European Microwave Conference, Sep. 1989, pp. 1270-1275.

* cited by examiner

*Primary Examiner* — Dinh T Le (57) ABSTRACT

A variable attenuator comprises a series resistance, and an adjustable shunt resistance, wherein the adjustable shunt resistance comprises a series circuit of a fixed resistor and a semiconductor element having an adjustable resistance.

9 Claims, 6 Drawing Sheets

VARIABLE ATTENUATOR

CROSS-REFERENCE TO RELATED APPLICATIONS

This is a continuation of PCT Patent Application No. PCT/EP2012/060263 filed May 31, 2012, which is incorporated herein in its entirety.

TECHNICAL FIELD

Embodiments of the invention relate to a variable attenuator and a resistive attenuator structure. Further embodiments of the invention relate to a variable attenuator with a reduced attenuation range.

BACKGROUND OF THE INVENTION

Attenuators are two-port devices used to reduce the amplitude of an input signal, ideally without reflections. Such attenuators may be fixed or variable and differ substantially one from each other depending on the technology adopted.

In Roberto Sorrentino, Giovanni Bianchi, Microwave and RF Engineering, 2010, John Wiley & Sons, Ltd, pp. 190-192, structures and operating principles of passive broadband attenuators are described.

In Roberto Sorrentino, Giovanni Bianchi, Microwave and RF Engineering, 2010, John Wiley & Sons, Ltd, pp. 359-400, it is further shown how it is possible to design variable (voltage or current control) broadband attenuators by replacing the resistors of fixed attenuators with semiconductor devices, such as field-effect transistors (PET) or PIN diodes. Such variable attenuators present a variable attenuation, which depends on some control variables. In principle, a continuously variable attenuator is nothing more than a fixed attenuator (e.g., in a T or II configuration) where controlled variable resistors replace fixed ones. In the following, an example FET implementation of a conventional continuous-variable attenuator will be described.

Figure 3:
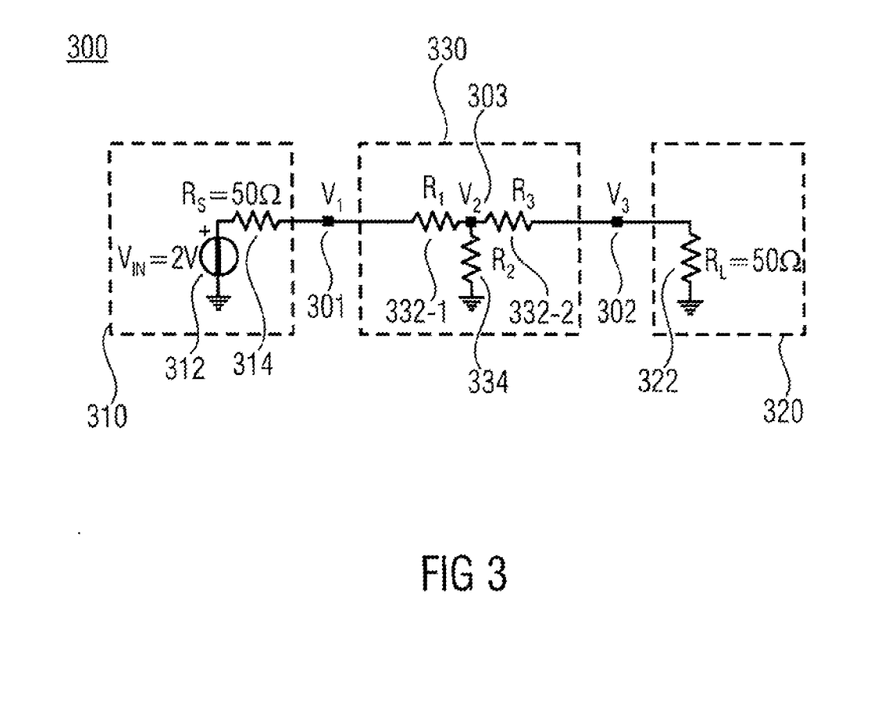
FIG. 3 shows a schematic diagram of an implementation of a resistive T attenuator according to the prior art.

FIG. 3 shows a schematic diagram of a resistive attenuator structure 300 according to the prior art. The conventional resistive attenuator structure 300 comprises as source 310, a load 320 and a resistive attenuator 330 in a T configuration. The resistive attenuator 330 in the T configuration can also be referred to as a resistive T attenuator. The source 310 of the resistive attenuator structure 300 may comprise a voltage generator 312 for generating a source voltage (e.g., $V_{IN}=2V$) and source resistance 314 (e.g., $R_S=50\Omega$). As shown in FIG. 3, the source 310 may be configured for providing an RF input voltage ($V_1$) at a first port 30 (input port). In addition, the load 320 of the resistive attenuator structure 300 may be coupled to a second port 302 (output port). The load 320 may comprise a load resistance 322 (e.g. $R_L=50\Omega$). At the output port 302, there will be an RF output voltage ($V_3$). Referring to the schematic diagram of FIG. 3, the resistive T attenuator 330 is connected between the first port 301 or input port and the second port 302 or output port. The resistive T attenuator 330 may comprise a first series resistance 332-1, $R_1$, a second series resistance 332-2, $R_3$, and a shunt resistance 334, $R_2$. The first port 301 or input port is connected to the first series resistance 332-1, while the second port 302 or output port is connected to the second series resistance 332-2. Moreover, the first and the second series resistances 332-1, 332-2 are connected in series between the first and the second ports 301, 302, As shown in FIG. 3, the shunt resistance 334 is connected between the first and the second series resistances 332-1, 332-2. The shunt resistance 334 is coupled to an intermediate node 303 (voltage $V_2$).

The conventional resistive attenuator structure 300 of FIG. 3 can be characterized by the following synthesis formulae:

$$R_1(A_{dB}) = R_3(A_{dB}) = R_0 \frac{1 - 10^{-\frac{A_{dB}}{20}}}{1 + 10^{-\frac{A_{dB}}{20}}}$$

$$R_2(A_{dB}) = R_0 \frac{2 \cdot 10^{-\frac{A_{dB}}{20}}}{1 - 10^{-\frac{A_{dB}}{20}}}$$

Here, $R_0$ and $A_{dB}$ denote the working or reference impedance (50Ω in most cases) and a predefined attenuation in dB of the resistive T attenuator, respectively.

In the following, the voltages $V_2$, $V_3$ at the different nodes (at node 303 and at the output port 302) are given for an example unitary RF input voltage. This means that in FIG. 3, $V_1=1$ at the input port 301. Those voltages $V_2$, $V_3$ given rough estimation of the compression. Note that a voltage source amplitude of 2V gives $V_1=1$ if the attenuator is impedance matched, as it is if its component values are given by the synthesis formulae (see equations above). The corresponding equations read:

$$V_2(A_{dB}) = \frac{\frac{[R_3(A_{dB}) + R_0] \cdot R_2(A_{dB})}{R_3(A_{dB}) + R_0 + R_2(A_{dB})}}{\frac{[R_3(A_{dB}) + R_0] \cdot R_2(A_{dB})}{R_3(A_{dB}) + R_0 + R_2(A_{dB})} + R_1(A_{dB})}$$

$$V_3(A_{dB}) = V_3(A_{dB}) \frac{R_0}{R_0 + R_3(A_{dB})}$$

$$\frac{\partial [V_3(A_{dB}) - V_2(A_{dB})]}{\partial A_{dB}} = \frac{\ln(10)}{20} \frac{10^{-\frac{A_{dB}}{20}} - 10^{-\frac{A_{dB}}{20}} + 2}{\left(1 + 10^{-\frac{A_{dB}}{20}}\right)^2}$$

Figure 4:
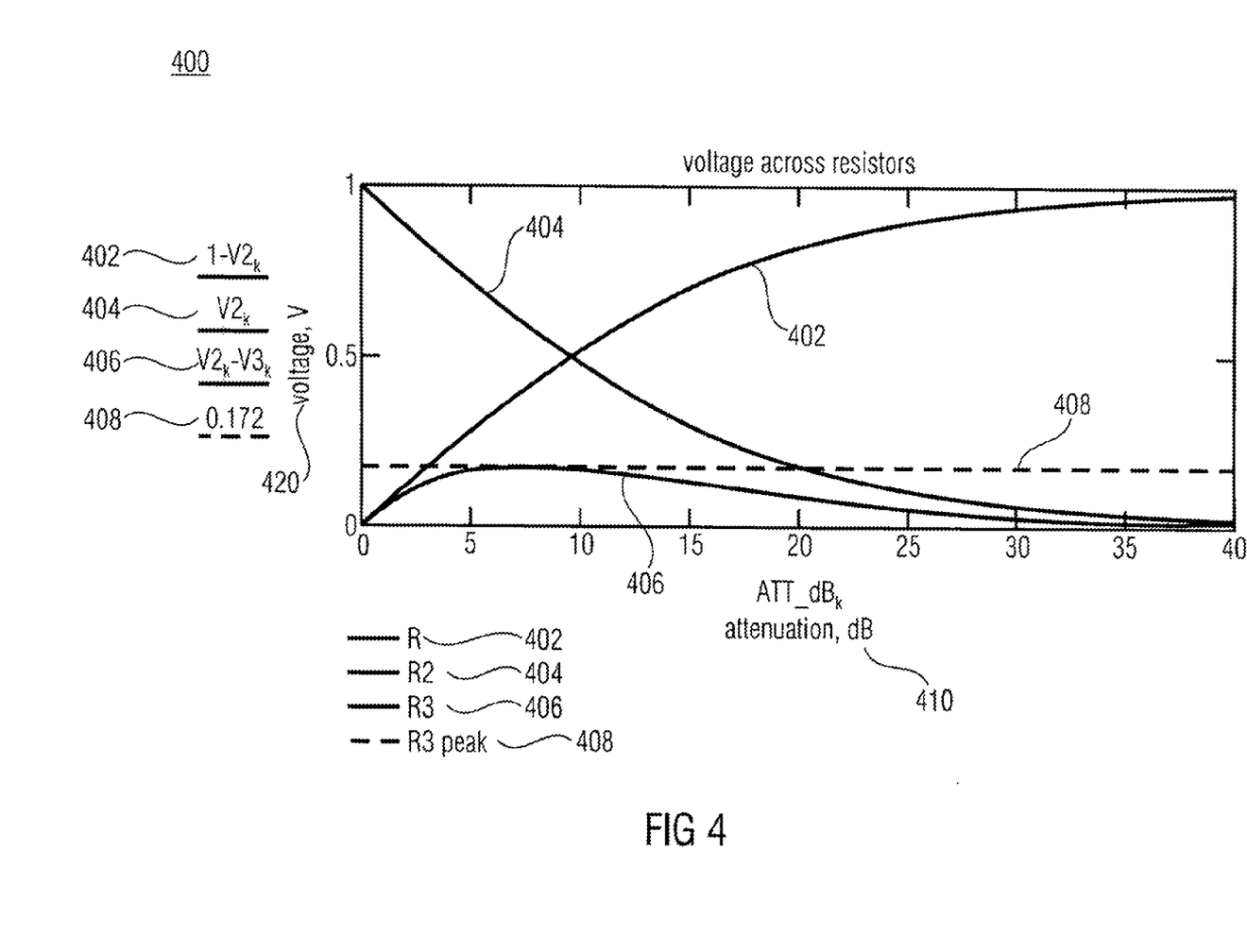
FIG. 4 shows a graph of example voltages across resistors of the resistive T attenuator from FIG. 3 in dependence on an attenuation in dB when an input RF voltage amplitude is unitary.

FIG. 4 shows a graph 400 of example voltages across the attenuator's resistors (402, 404, 406) in dependence on the attenuation in dB ($ATT\_dB_k$) for the circuit of FIG. 3 when the input RF voltage amplitude is unitary ($V_1=1$). In the graph 400 of FIG. 4, the y-axis (ordinate) refers to the voltage 420 in V, while the x-axis (abscissa) refers to the attenuation 410 in dB. Note that the maximum voltage across R1 (the first series resistance 332-1 of the resistive attenuator 330 in FIGS. 3) and R2 (the shunt resistance 334 of the resistive attenuator 330 in FIG. 3) is unitary, while the maximum amplitude across R3 (the second series resistance 332-2 of the resistive attenuator 330 in FIG. 3) is 0.173, which is much smaller. Therefore, from this point, we will focus our attention on the resistances R1, R2. More precisely, that peak 408 (which corresponds to a maximum of the curve 406 for the voltage across the resistance R3) is achieved for an attenuation of $20\log_{10}(1+0.5^{0.5})=7.656$ dB and equals to $(1+0.5^{0.5})^{-2}=0.173$. In the following, the sensitivity of the attenuation to the component values will be derived.

The attenuation ($\alpha$ or V3/V1) in linear units with its derivatives in respect of the various resistances is given by the following equations:

$$\frac{V3}{V1} = \frac{\frac{R2}{R_0}}{\frac{R2}{R_0}\cdot\left(1+\frac{R1}{R_0}+\frac{R3}{R_0}\right)+\frac{R1}{R_0}\cdot\left(1+\frac{R3}{R_0}\right)}$$

$$\alpha = \frac{\frac{R2}{R_0}}{\frac{R2}{R_0}\cdot\left(1+\frac{R1}{R_0}+\frac{R3}{R_0}\right)+\frac{R1}{R_0}\cdot\left(1+\frac{R3}{R_0}\right)}$$

$$\begin{bmatrix} \frac{d}{dR1}\alpha = \frac{\frac{R2}{R_0}\cdot\left(1+\frac{R2}{R_0}+\frac{R3}{R_0}\right)\cdot\frac{1}{R_0}}{\left[\frac{R2}{R_0}\cdot\left(1+\frac{R1}{R_0}+\frac{R3}{R_0}\right)+\frac{R1}{R_0}\cdot\left(1+\frac{R3}{R_0}\right)\right]^2} \\ \frac{d}{dR2}\alpha = \frac{\left(1+\frac{R3}{R_0}\right)\cdot\frac{R1}{R_0}\cdot\frac{1}{R_0}}{\left[\frac{R2}{R_0}\cdot\left(1+\frac{R1}{R_0}+\frac{R3}{R_0}\right)+\frac{R1}{R_0}\cdot\left(1+\frac{R3}{R_0}\right)\right]^2} \\ \frac{d}{dR3}\alpha = \frac{\frac{R2}{R_0}\cdot\left(\frac{R2}{R_0}+\frac{R1}{R_0}\right)\cdot\frac{1}{R_0}}{\left[\frac{R2}{R_0}\left(1+\frac{R1}{R_0}+\frac{R3}{R_0}\right)+\frac{R1}{R_0}\cdot\left(1+\frac{R3}{R_0}\right)\right]^2} \end{bmatrix}$$

Figure 5:
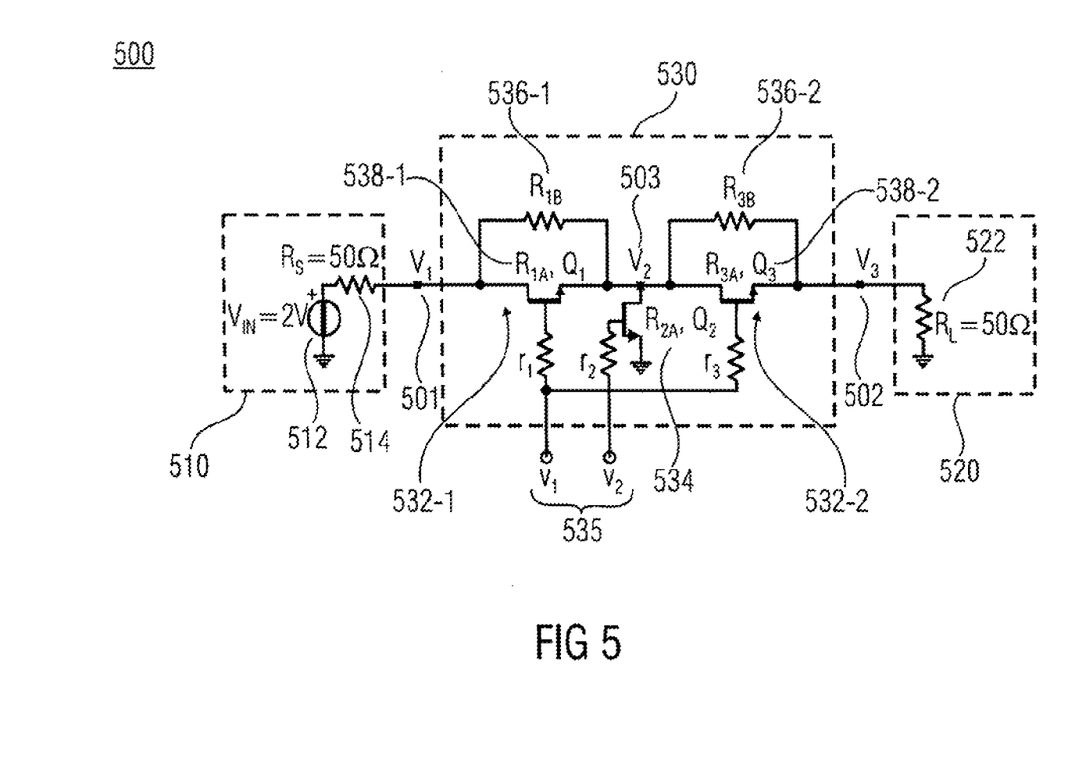
FIG. 5 shows a schematic diagram of an FET implementation of a conventional continuous-variable FET attenuator.
Figure 6:
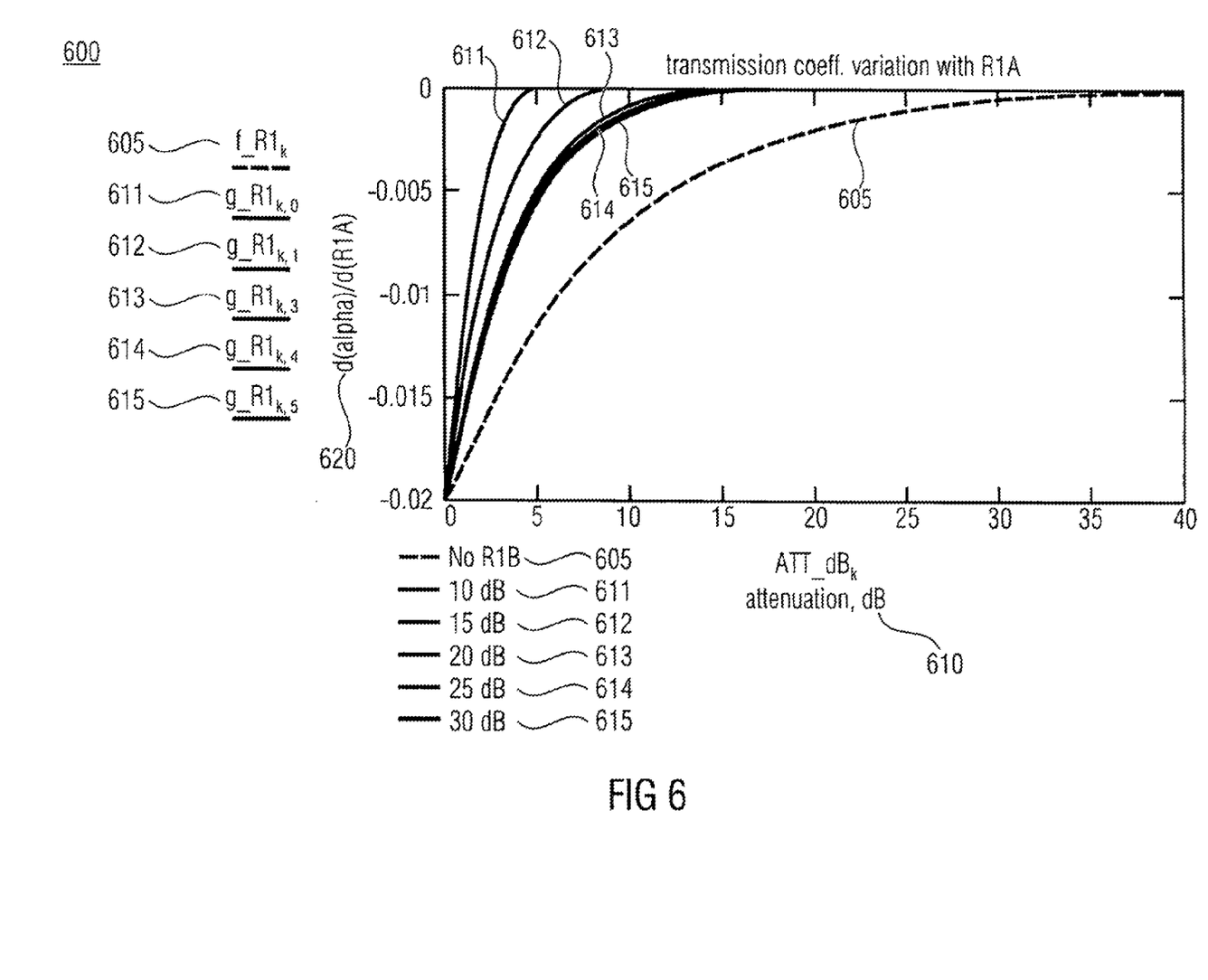
FIG. 6 shows a graph of example derivatives of a transmission coefficient amplitude in respect of a drain-source resistance of an FET of a parallel circuit of an adjustable series resistance within the FET implementation from FIG. 5, as a function of a set attenuation in dB.

Subsequently, the FET implementation of the continuous-variable attenuator is described with reference to FIGS 5 and 6. FIG. 5 shows a schematic diagram of a conventional continuous-variable FET attenuator 530 within the FET implementation 500. In the FET implementation 500 of FIG. 5, a source 510 comprising a voltage generator 512 and a source resistance 514, a load 520 comprising a load resistance 522 and the variable FET attenuator 530 are shown. Here, the source 510 with the circuit elements 512, 514 and the load 520 with the load resistance 522 as shown in the FET implementation 500 of FIG. 5 essentially correspond to the source 310 with the circuit elements 312, 314 and the load 320 with the load resistance 322 as shown in the resistive attenuator structure 300 of FIG. 3. Correspondingly, the source 510 is configured for providing an RF input voltage $V_1$ at a first port 501, while the load 520 is coupled to a second port 502. The variable FET attenuator 530 is connected between the first and the second ports 501, 502.

The variable FET attenuator 530 of FIG. 5 comprises a first series resistance 532-1, a second series resistance 532-2 and an adjustable shunt resistance 534. As shown in FIG. 5, the first and the second series resistances 532-1, 532-2 may be configured to be adjustable. The first and the second adjustable series resistances 532-1, 532-2 and the adjustable shunt resistance 534 may be implemented by using controllable field street transistors (FET).

The control of the adjustable resistances of the FET can be achieved by providing a bias network 535. The FET implementation 500 of FIG. 5 essentially represents a limited maximum attenuation structure.

Here, the first and the second series resistances 532-1, 532-2 and the adjustable shunt resistance 534 of the variable FET attenuator 530 in FIG. 5 essentially correspond to the first and the second series resistances 332-1, $R_1$, 332-2, $R_3$, and the shunt resistance 334, $R_2$, of the resistive T attenuator 330 in FIG. 3. However, the first and the second series resistances 532-1, 532-2 and the shunt resistance 534 of FIG. 5 represent adjustable resistances, while the first and the second series resistances 332-1, 332-2 and the shunt resistance 334 of FIG. 3 represent fixed resistances.

Referring to the implementation of FIG. 5, each of the first and the second series resistances 532-1, 532-2 of the variable FET attenuator 530 comprises a parallel circuit of a fixed resistor 536-1, $R_{1B}$; 536-2, $R_{3B}$, and an FET element 538-1, $Q_1$; 538-2, $Q_3$.

In the following considerations, the drain-source resistance of the FET $Q_1$, $Q_3$ ($Q_2$: FET element associated with the adjustable shunt resistance 534) will be denoted as $R_{1A}=R_{ds}(Q_1)$, $R_{3A}=R_{ds}(Q_3)$ [$R_2=R_{ds}(Q_2)$]. Hence, $R_1=R_{1A}/R_{1B}$ and $R_3=R_{3A}/R_{3B}$.

The resistances $R_{1B}=R_{3B}$ assume the value of $R_1=R_3$ corresponding to the maximum attenuation (in the maximum attenuation state, $Q_1$ and $Q_3$ are completely pinched-off). Namely, if the maximum attenuation in dB is 1, 2, 3, 5, 6, 10, 20, 30, or 40 dB, the resulting resistances (in the case of $R_0=50\Omega$) $R_{1B}=R_{3B}$ become 2.875, 5.731, 8.55, 14.006, 16.614, 25.975, 40.909, 46.935, or 49.01, respectively.

$$R1B = \begin{bmatrix} 1 & 2.875 \\ 2 & 5.731 \\ 3 & 8.55 \\ 5 & 14.006 \\ 6 & 16.614 \\ 10 & 25.975 \\ 20 & 40.909 \\ 30 & 46.935 \\ 40 & 49.01 \end{bmatrix}$$

The above table gives the maximum series resistance (i.e., $R_{1B}=R_{3B}$) for different values of the maximum attenuation (the two quantities are reciprocally monotonic). On the right hand side of that equation, the first column describes the maximum attenuation in dB, while the second column describes $R_{1B}=R_{3B}$.

Referring to the implementation of FIG. 5, it is important to note that the fixed resistors 536-1, 536-2, $R_{1B}=R_{3B}$ are in shunt between the drain-source of the series transistors 538-1, 538-2 ($Q_1$, $Q_3$). That reduces the sensitivity of the global series resistances 532-1, 532-2 ($R_1$, $R_3$) to the drain-source resistance ($R_{1A}$, $R_{3A}$) of the transistors.

Indeed, let $\alpha$ be the transmission coefficient amplitude in linear units, then its derivative respect of the series input resistance is $$\frac{\partial[\alpha(R_1,R_2,R_3)]}{\partial R_1} = -\frac{\frac{R_2}{R_0}\cdot\left(1+\frac{R_2}{R_0}+\frac{R_3}{R_0}\right)\cdot\frac{1}{R_0}}{\left[\frac{R_2}{R_0}\cdot\left(1+\frac{R_2}{R_0}+\frac{R_3}{R_0}\right)+\frac{R_1}{R_0}\cdot\left(1+\frac{R_3}{R_0}\right)\right]^2}$$

The resulting input series resistance is $R_1=R_{1A}/R_{1B}$.

The derivative of $\alpha$ in respect of the drain-source resistance ($R_{1A}$) of $Q_1$ can be found by applying the derivation rule for composite functions, which gives $$\frac{\partial\left[\alpha\left(R_1=\frac{R_{1A}\cdot R_{1B}}{R_{1A}+R_{1B}},R_2,R_3\right)\right]}{\partial R_{1A}} = \frac{\partial[\alpha(R_1,R_2,R_3)]}{\partial R_1}\cdot\frac{\partial\left(\frac{R_{1A}\cdot R_{1B}}{R_{1A}+R_{1B}}\right)}{\partial R_{1A}}$$

The following description relates to a numerical computation of the derivative of the transmission coefficient amplitude in respect of the drain-source resistance ($R_{1A}$) of $Q_1$, as a function of the set attenuation and for different values of set and maximum attenuation. This numerical computation gives:

$$R1B\_Att\_Max\_dB = \begin{bmatrix} 5 & 14.006 \\ 10 & 25.975 \\ 15 & 34.902 \\ 20 & 40.909 \\ 25 & 44.676 \\ 30 & 46.935 \end{bmatrix}$$

On the right hand side of the above equation, the first column describes the maximum attenuation in dB, while the second column describes the fixed series resistance $R_{1B}$, $R_{3B}$. Moreover, FIG. 6 shows a graph 600 of derivatives 620 of the transmission coefficient amplitude ($\alpha$) in respect of the drain-source resistance ($R_{1A}$) of $Q_1$, as a function of the set attenuation 610 (ATT_dBk), for different values (611, 612, 613, 614, 615) of set and maximum attenuation. In the graph 600 of FIG. 6, the dashed curve 605 indicated by "No R1B" refers to the case of the absence of the fixed series resistance $R_{1B}$.

Note that the presence of the fixed series resistance $R_{1B}$ has no mitigation effect at zero attenuation, as expected, since $R_{1A}=0$ in that state.

Nevertheless, any practical attenuator of the type in FIG. 5 has a nonzero minimum attenuation (insertion-loss), which typically falls between 1 and 2 dB. At that minimum insertion-loss, the sensitivity reduction of the transmission coefficient to $R_{1A}$ ranges from 30% to 80% if the maximum attenuation is 5 dB and if the minimum ranges between 1 and 3 dB, as the following computations show:

$$GR1 = \begin{bmatrix} 5 & 0.702 & 0.424 & 0.198 \\ 10 & 0.879 & 0.737 & 0.587 \\ 15 & 0.936 & 0.848 & 0.743 \\ 20 & 0.961 & 0.897 & 0.816 \\ 25 & 0.973 & 0.922 & 0.852 \\ 30 & 0.979 & 0.935 & 0872 \end{bmatrix}$$

The above equation gives the sensitivity reduction (improvement) factor of the linear attenuation to the input FET drain-source resistance. In particular, on the right hand side of that equation, the first column indicates the maximum attenuation in dB, while the second, third and fourth columns show the values for a minimum attenuation of 1, 2 and 3 dB respectively.

However, it has been found that the conventional variable attenuators including the FET implementation of the continuous-variable attenuator according to FIG. 5 present some problems.

Firstly, it has been found that the resistance that the used semiconductor devices present in RF is not only a function of the applied control quantity (voltage for FET or current for PIN diodes). Rather, such resistance is also depending from the RF voltage applied to the device itself. As a consequence, the attenuation is not constant with the applied RF power.

Moreover, the classical well-known nonlinear (undesired) effects affect the variable attenuator. These are power compression, harmonic (with single-tone excitation) and intermodulation (with multiple-tone excitation) distortion.

Secondly, it has been found that the precision of the actuated attenuation value depends on the precision of the applied control quantity. In some cases and/or regions of the attenuation value, the sensitivity of the latter to the control quantity value could be quite high. A typical case is with FET devices at intermediate (between minimum and maximum) attenuation values, when the FET operate close to their pinch-off region (although not completely pinched-off).

Thirdly, it has been found that semiconductor devices sometimes present long-term settling time effects when abrupt changes are applied on the control quantity. Thus, the resulting RF equivalent resistance reaches a value close to the final one within a short time (in the order of nanoseconds), but the residual change needs a long time (up to seconds) to set. Consequently, the RF attenuation response to the control quantity could be very slow, particularly if precise and accurate attenuation values are required.

Furthermore, it must be noted that in a maximum attenuation limited attenuator, such as in the conventional continuous-variable FET attenuator of FIG. 5, the series resistance has a maximum value smaller than the working resistance ($R_O$). In the previous description, it has been shown that this helps in keeping the attenuation variations less sensitive to the FET channel resistance, which is inherently nonlinear and depends on the applied input power. However, it has been found that also in the case of the maximum attenuation limited attenuator, it is sometimes difficult to avoid the above mentioned problems, especially for a good realization in practical cases.

Therefore, it is an object of the present invention to provide a concept of a variable attenuator which allows a better characteristic of an attenuation in a real implementation.

This object is achieved by a variable attenuator according to claim 1 or a resistive attenuator structure according to claim 12.

The basic idea underlying the present invention is that the above-mentioned concept of the variable attenuator can be achieved if a series resistance and an adjustable shunt resistance are provided, wherein the adjustable shunt resistance comprises a series circuit of a fixed resistor and a semiconductor element having an adjustable resistance. This allows to obtain the better attenuation characteristic in the context of a real implementation of the variable attenuator.

According to an embodiment of the present invention, a variable attenuator comprises a series resistance and an adjustable shunt resistance. The adjustable shunt resistance comprises a series circuit of a fixed resistor and a semiconductor element having an adjustable resistance.

According to a further embodiment of the present invention, the semiconductor element of the series circuit of the adjustable shunt resistance is a field-effect transistor (FET). The field-effect transistor is configured such that, for a minimum attenuation value in a range of 1 to 3 dB, a voltage applied between a drain and a source of the field-effect transistor is reduced by a voltage reduction value in a range of 10 to 60% as compared to a voltage applied between the drain and the source of the field-effect transistor alone. By such a voltage reduction, some of the undesired nonlinear effects originating from the field-effect transistor can be efficiently reduced. Therefore, an improved quality of the attenuation provided with the variable attenuator can be achieved.

According to a further embodiment of the present invention, a resistive attenuator structure comprises a source, a load and an inventive variable attenuator. The source is configured for providing an RF input voltage at a first port. The load is coupled to a second port. The inventive variable attenuator is connected between the first port and the second port.

BRIEF DESCRIPTION OF THE FIGURES

Embodiments according to the present invention will subsequently be described taking reference to the enclosed figures in which.

DETAILED DESCRIPTION OF THE EMBODIMENTS

Figure 1:
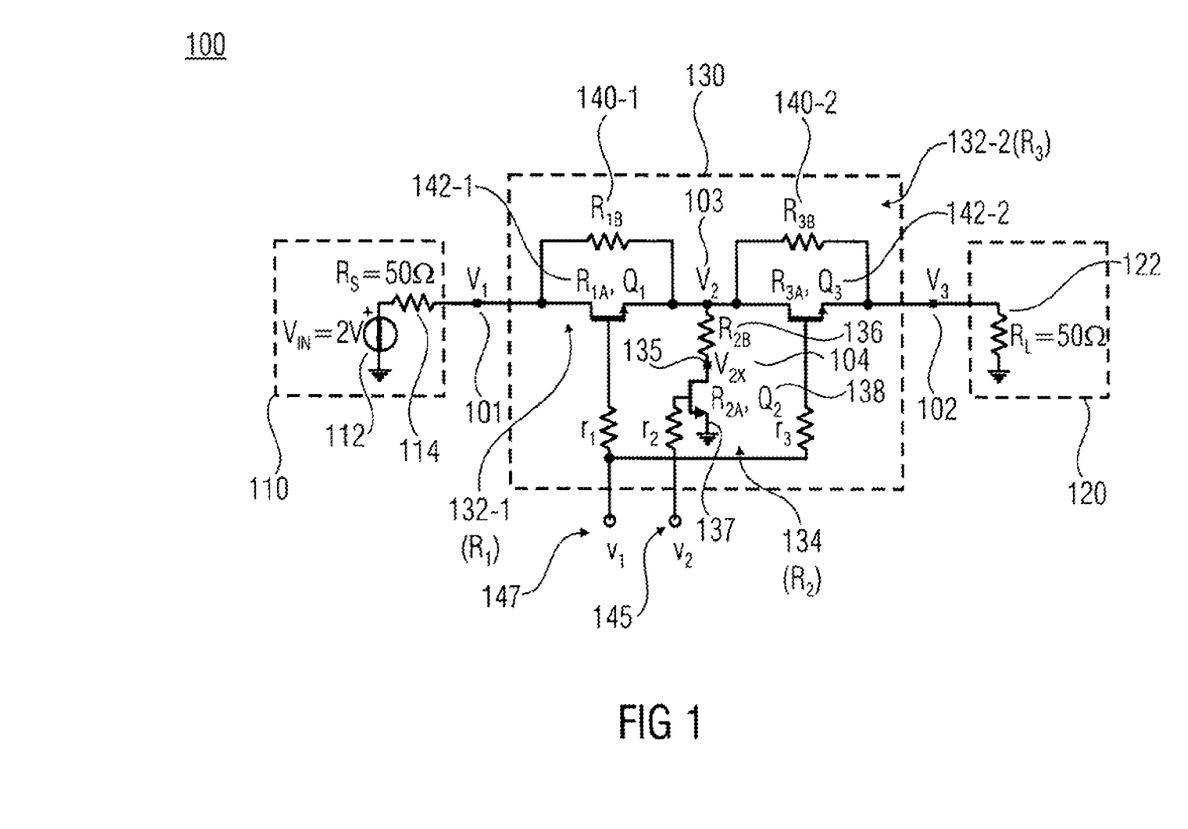
FIG. 1 shows a schematic diagram of a variable attenuator with an adjustable shunt resistance according to an embodiment of the invention.

FIG. 1 shows a schematic diagram of a variable attenuator 130 comprising an adjustable shunt resistance 134 according to an embodiment of the invention. The embodiment of the variable attenuator 130 may be included within a resistive attenuator structure 100 as shown in FIG. 1. Referring to the embodiment of FIG. 1, the variable attenuator 130 comprises a series resistance 132-1, $R_1$, and an adjustable shunt resistance 134, $R_2$. The adjustable shunt resistance 134 comprises a series circuit of a fixed resistor 136, $R_{2B}$, and a semiconductor element 138, $Q_2$, having an adjustable resistance $R_{2A}$. By controlling the adjustable resistance $R_{2A}$, it is possible to controllably adjust the attenuation of an RF signal propagating through the variable attenuator 130. Specifically, the variable attenuator 130 in the embodiment of FIG. 1 may represent a variable attenuator with a reduced attenuation range or a limited maximum attenuation circuit.

In embodiments, the series resistance 132-1 and the adjustable shunt resistance 134 of the variable attenuator 130 may be configured to provide a predefined attenuation range of the variable attenuator 130, wherein the predefined attenuation range may comprise attenuation values in a range of 1 to 30 dB or 5 to 10 dB. Thus, the attenuation range can essentially be reduced as compared to a typical attenuation range for FET attenuators, which is about 30 dB.

According to the embodiment FIG. 1, the variable attenuator 130 further comprises a further series resistance 132-2, $R_3$. As shown in FIG. 1, a first port 101 (input port) is connected to the series resistance 132-1, while a second port 102 (output port) is connected to the further series resistance 132-2. Moreover, the series resistance 132-1 and the further series resistance 132-2 are connected in series between the first port 101 and the second port 102. It is further shown in FIG. 1 that the adjustable shunt resistance 134 is connected between the series resistance 132-1 and the further series resistance 132-2. The adjustable shunt resistance 134 is coupled to an intermediate node 103 (voltage $V_2$). This specific configuration of the variable attenuator 130 as shown in FIG. 1 essentially corresponds to a variable attenuator in a T configuration.

In further embodiments, the variable attenuator may also be implemented in a Π (or P) configuration (not shown). In such a Π configuration, the series resistance 132-1 of the variable attenuator 130 may be connected between a first port (input port) and a second port (output port). In addition, the adjustable shunt resistance 134 of the variable attenuator 130 may be connected between the first port and the series resistance 132-1. The variable attenuator of such a Π configuration represents an alternative to the variable attenuator 130 in the T configuration as shown in FIG. 1.

In further embodiments according to FIG. 1, the series resistance 132-1 may be configured to be adjustable. Here, the adjustable series resistance 132-1 comprises a parallel circuit of a fixed resistor 140-1, $R_{1B}$, and a semiconductor element 142-1, $Q_1$, having an adjustable resistance $R_{1A}$.

Additionally, the further series resistance 112-2 may also be configured to be adjustable. Here, the adjustable further series resistance 132-2 comprises a parallel circuit of a further fixed resistor 140-2, $R_{3B}$, and a further semiconductor element 142-2, $Q_3$, having an adjustable resistance $R_{3A}$.

In case that the series resistance 132-1 is adjustable, the semiconductor element 138, $Q_2$, of the series circuit of the adjustable shunt resistance 134 and the semiconductor element 142-1, $Q_1$, of the parallel circuit of the adjustable series resistance 132-1 may be controllable PIN diodes or controllable field-effect transistors (FET).

Additionally, in the case that the further series resistance 132-2 is adjustable, the semiconductor element 142-2, $Q_3$, of the parallel circuit of the adjustable further series resistance 132-2 may also be a controllable PIN diode or a controllable FET.

The controllable PIN diodes or controllable field-effect transistors can be used to controllably adjust the adjustable resistances $R_{2A}$ associated with the adjustable shunt resistance 134, the adjustable resistance $R_{1A}$ associated with the series resistance 132-1 and the adjustable resistance $R_{3A}$ associated with the further series resistance 132-2 by applying control signals. In case of driving the controllable PIN diodes, corresponding driving currents can be used, while in case of driving the FET, corresponding driving voltages can be used.

In further embodiments, the series circuit of the adjustable shunt resistance 134 of the variable attenuator 130 may be configured such that a resistance adjustment range of the adjustable shunt resistant 134 will be reduced as compared to a resistance adjustment range of the semiconductor element 138, $Q_2$, of the series circuit of the adjustable shunt resistance 134 alone.

For example, the series circuit of the adjustable shunt resistance 134 may be configured such that a resistance adjustment range of the adjustable shunt resistance 134 will be obtained, wherein the resistance adjustment range comprises resistance values ranging from infinity to a minimum resistance value. For example, if the adjustable resistance $R_{2A}$ associated with the adjustable shunt resistance 134 is adjusted in a range of infinity to zero, the minimum resistance value associated with the adjustable shunt resistance 134 will correspond to the fixed resistor 136, $R_{2B}$, which is obtained for an adjustable resistance $R_{2A}=0$.

According to further embodiments, the fixed resistor 136, $R_{2B}$, of the series circuit of the adjustable shunt resistance 134 may be configured to provide the minimum resistance value ($R_{2B}$), wherein the resistance values ($R_{2B}$) will be determined based on a predefined maximum attenuation ($\max(ATT_{dB})$) of the variable attenuator 130.

In particular, the fixed resistor 136, $R_{2B}$, may be chosen such that $R_{2B}=R_2[\max(ATT_{dB})]$. This means that the minimum resistance value ($R_{2B}$) essentially corresponds to the adjustable shunt resistance 134 ($R_2$) evaluated at the predefined maximum attenuation in dB ($\max(ATT_{dB})$).

Thus, the resistance adjustment range of the adjustable shunt resistance 134 is basically given by $R_2 \epsilon R_{2B} \ldots \infty$.

Similarly, the resistance adjustment range of the parallel circuit of the adjustable series resistance 132-1, $R_1$, may comprise resistance values ranging from zero to a maximum resistance value ($R_{1B}$). This maximum resistance value associated with the adjustable series resistance 132-1, $R_1$, is essentially determined by the fixed resistor 140-1, $R_{1B}$. Thus, the resistance adjustment range associated with the adjustable series resistance 132-1 is basically given by $R_1 \epsilon 0 \ldots R_{1B}$.

Referring to the embodiment of FIG. 1, the semiconductor element 138, $Q_2$, of the series circuit of the adjustable shunt resistance 134 may be a field-effect transistor (FET). Here, the field-effect transistor 138 may be configured such that, for a minimum attenuation value in a range of 1 to 3 dB, a voltage applied between a drain 137 and a source 135 of the field-effect transistor 138 will be reduced by a voltage reduction value in a range of 10 to 60% as compared to a voltage applied between the drain and the source of the field-effect transistor alone. By such a voltage reduction, it is possible to efficiently reduce some of the undesired nonlinear effects which originate from the field-effect transistor 138. Thus, it has been found that an improved quality of the attenuation provided with the variable attenuator 130 can be achieved.

In further embodiments, the variable attenuator 130 may further comprise a controller (not shown) and a bias configuration 145, wherein the bias configuration 145 is associated with the adjustable shunt resistance 134. Moreover, the controller may be configured to control the adjustable resistance $R_{2A}$ of the semiconductor element 138, $Q_2$, of the adjustable shunt resistance 134 by using a control signal (driving current or voltage $v_2$)). In case that the semiconductor element 138, $Q_2$, is an FET, the bias configuration 145 associated with the adjustable shunt resistance 134 may comprise a control path including a control path resistance $r_2$ for supplying the gate of the FET with the control signal (i.e. voltage v2).

Additionally, the variable attenuator 130 may further comprise a further bias configuration 147 controlled by the controller, wherein the further bias configuration 147 is associated with the adjustable series resistance 132-1. Here, the controller may be configured to control the adjustable resistance $R_{1A}$ of the semiconductor element 142-1, $Q_1$, of the adjustable series resistance 132-1 by using a further control signal (driving current or voltage $v_1$). In case that the semiconductor element 142-1, $Q_1$, is an FET, the further bias configuration 147 associated with the adjustable series resistance 132-1 may comprise a further control path including a control path resistance $r_1$ for supplying the gate of the FET with the control signal (i.e. voltage $v_1$).

As described before, the variable attenuator 130 is included into the resistive attenuator structure 100 of FIG. 1. As shown in FIG. 1, the resistive attenuator structure 100 comprises a source 110, a load 120 and the variable attenuator 130. Here, the source 110 is configured for providing an RF input voltage $V_1$ at a first port 101. The source 110 may comprise a voltage generator 112 (e.g. $V_{IN}$=2V), and a source resistance 114 (e.g. $R_S$=50Ω). Here, it is to be noted that the voltage is defined as the potential difference between two points (nodes) generally measured against a common reference potential (ground). The load 120 is coupled to a second port 102. The load 120 is characterized by a load resistance (e.g. $R_L$=50Ω). Moreover, the variable attenuator 130 in the embodiment of FIG. 1 is connected between the first port 101 and the second port 102. The resistive attenuator structure 100 from FIG. 1 essentially represents a symmetrical implementation of a variable attenuator structure with a reduced attenuation range.

In the description of the present invention, it is often referred to a 50 Ohm load ($R_L$=50Ω) and source impedance ($R_S$=50Ω). That simplified expressions and notations, without lack of generality. If a reference impedance different from 50 Ohm is used, the attenuator resistances must be re-normalized on the new value. However, the considerations about the improvement of the present invention remain untouched (i.e., qualitatively and quantitatively). The example impedance value of 50 Ohm is, however, consistently the much more used one. Exceptions are quite few.

It is further pointed out that referring to FIGS. 1, 3, 5, and in some computations, an example input RF source voltage amplitude ($V_{IN}$) of 2V is used. This is only to simplify the computations themselves, in that it gives an RF unitary RF voltage input amplitude ($V_1$), since the attenuator is—definition—matched to the reference impedance. No lack of generality (neither from the qualitative, nor from the quantitative point of view) follows from such an assumption, since the discussion is based on linear elements and voltage ratios.

To recap the embodiment of FIG. 1, it has been found that the adjustable shunt resistance preferably ranges from infinity (open circuit) to a minimum value, given by the synthesis formulae of the introduction section computed at the maximum attenuation. That offers the opportunity to realize the adjustable shunt resistance ($R_2$) as the series of the fixed resistor $R_{2B}$=$R_2$[max($ATT_{dB}$)] combined with the drain-source resistance ($R_{2A}$) of the semiconductor element $Q_2$ associated with the adjustable shunt resistance $R_2$, $R_{ds}(Q_2)$=$R_{2A}$. Such a solution has been described in the context of the embodiment of FIG. 1. The embodiment of FIG. 1 essentially represents a variable attenuator with a partialized shunt resistance.

It is pointed out here that the inventive variable attenuator or the arrangement described with reference to FIG. 1 does not mitigate the derivative of the transmission coefficient amplitude $\alpha$ in respect of the channel resistance of the semiconductor element $Q_2$ associated with the adjustable shunt resistance, as it immediately follows from the composite function derivation rule:

$$\frac{\partial [\alpha(R_1, R_2 = R_{2A} + R_{2B}, R_3)]}{\partial R_{2A}} = $$
$$\frac{\partial [\alpha(R_1, R_2, R_3)]}{\partial R_2} \frac{\partial (R_{2A} + R_{2B})}{\partial R_2} = \frac{\partial [\alpha(R_1, R_2, R_3)]}{\partial R_2}$$

On the other hand, it has been found that the inventive arrangement of FIG. 1 reduces the RF voltage applied between the drain and the source of the shunt FET, via the voltage partition operated by the added resistor $R_{2B}$.

Such partition factor is unitary at zero attenuation (in that state $Q_2$ is open), but increases its effect as the set attenuation approaches the maximum possible. This can be illustrated as follows:

$$\frac{V_{2x}}{V_2} = \frac{R_{2A}}{R_{2A} + R_{2B}} = 1 - \frac{1 - 10^{-\frac{A_{dB}}{20}}}{1 - 10^{-\frac{max(A_{dB})}{20}}} 10^{\frac{A_{dB} - max(A_{dB})}{20}}$$

with $$\frac{V_{2x}}{V_2} = \begin{cases} 1 & (A_{dB} = 0) \\ 0 & [A_{dB} = max(A_{dB})] \end{cases}$$

Figure 2:
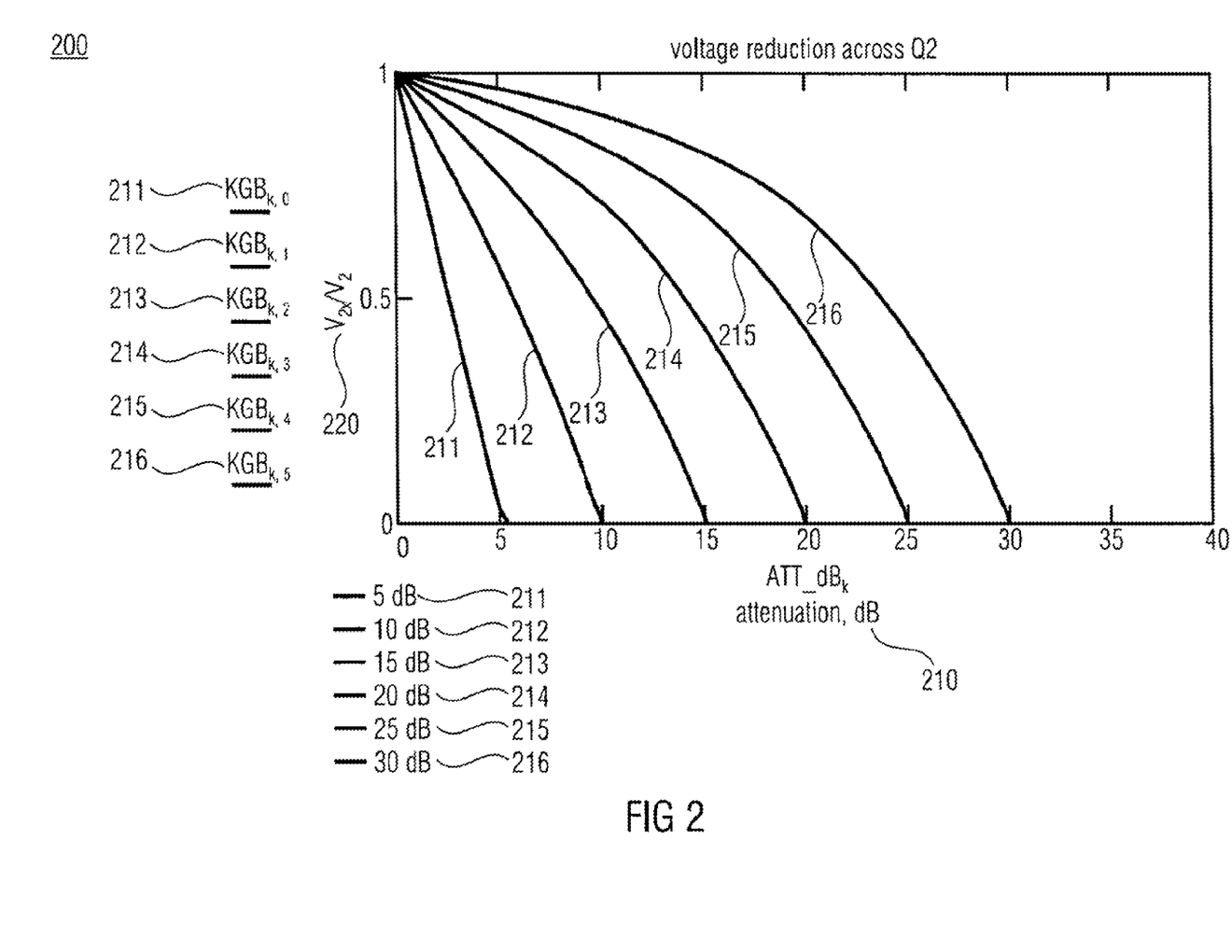
FIG. 2 shows a graph of example voltage reductions across a variable FET of a series circuit of the adjustable shunt resistance of the embodiment of the variable attenuator in accordance with FIG. 1.

FIG. 2 shows a graph 200 of example voltage reductions 211, 212, 213, 214, 215, 216 across a variable FET ($Q_2$) of a series circuit of the adjustable shunt resistance of the embodiment of the variable attenuator 130 in accordance with FIG. 1. The y-axis (ordinate) essentially represents a quotient 220 of the voltage 104, $V_{2x}$, and the voltage 103, $V_2$, in the series circuit of the adjustable shunt resistance 134 in the embodiment of FIG. 1. The x-axis (abscissa) of the graph 200 essentially represents the attenuation 210 in dB. In the graph 200 of FIG. 2, the different curves 211, 212, 213, 214, 215, 216 correspond to different values of the maximum attenuation in dB.

Similar to the conventional FET implementation as described with reference to FIG. 5, there is no improvement at zero attenuation (which is, however, not realizable in practicable cases). It is pointed out that the improvement factor ranges from 20% to 60% if the minimum insertion-loss ranges between 1 dB and 3 dB, as per the following computations:

$$V2X\_V2 = \begin{bmatrix} 5 & 0.81 & 0.618 & 0.421 \\ 10 & 0.919 & 0.837 & 0.752 \\ 15 & 0.958 & 0.915 & 0.871 \\ 20 & 0.977 & 0.953 & 0.929 \\ 25 & 0.987 & 0.974 & 0.96 \\ 30 & 0.993 & 0.985 & 0.978 \end{bmatrix}$$

The above equation is related to the voltage reduction (improvement) across the drain-source of $Q_2$. On the right-hand side of that equation, the first column indicates the maximum attenuation in dB, while the second, third, and fourth columns show the corresponding values for a minimum attenuation of 1, 2, and 3 dB, respectively.

The described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The inventive variable attenuator or attenuation circuit mitigates the inconveniences of the prior art as described before (such as the reduction of the attenuation quality due to some undesired nonlinear effects) when a limited attenuation range is required. To give some numbers, the typical attenuation range for FET attenuators operating in the DC-20 GHz range is 30 dB, while the inventive solution preferably works for a maximum-minimum attenuation range in the order of 5-10 dB.

The price to pay to achieve the described improvements in linearity, precision, and settling time is a reduced variation range of the attenuation, in comparison with the already available standard solutions known in the state of the art.

The inventive solution has been described in more detail for the case of a T attenuator realized with FET. However, the same considerations apply to any other possible realization of the controlled variable resistances, such as PIN diodes. Very similar considerations are also possible with attenuators.

To summarize, it has been described how a limited maximum attenuation circuit mitigates the attenuation dependence on the non-linear resistance of the FET at the minimum attenuation. Generally, continuously variable attenuators present their worst non-linear performances (i.e. low $P_{1dB}$) at intermediate attenuation sets, which are more improved as the few 10% shown so far.

Some embodiments of the invention provide the advantage that a reduced sensitivity of the attenuation to the drain-source resistance $R_{ds}$ of the FET will not only improve the compression performances, but also the so-called gate-leg effects (i.e. long-term residual settling time after a step variation on the gate control voltage. For instance, $R_{ds}$ reaches the 90% of its final value within few nanoseconds, while the remaining 10% needs many milliseconds to set).

What is claimed is:

1. A variable attenuator (130), comprising:
an adjustable series resistance (132-1) coupled between a first port (101) and a second port (102),
wherein the adjustable series resistance (132-1) includes a parallel circuit of a first fixed resistor (140-1) and a first semiconductor element (142-1) having an adjustable resistance ($R_{1A}$) as a function of a first control signal ($V_1$); and
an adjustable shunt resistance (134) coupled in series with the adjustable series resistance (132-1) between the first port (101) and a reference node,
wherein the adjustable shunt resistance (134) includes a series circuit of a second fixed resistor (136) and a second semiconductor element (138) having an adjustable resistance ($R_{2A}$) as a function of a second control signal ($V_2$), and
wherein the second semiconductor element (138) of the adjustable shunt resistance (134) is configured such that, for a minimum attenuation value in a range of 1 to 3 dB, a voltage applied between a drain (137) and a source (135) of the second semiconductor element (138) coupled in series with the second first resistor (136) is reduced by a voltage reduction value for the variable attenuator (130) in a range of 10 to 60% as compared to a shunt resistance consisting of a semiconductor element alone having a voltage applied between the drain and source of the semiconductor element alone.

2. The variable attenuator (130) according to claim 1, further comprising a further series resistance (132-2), wherein the adjustable series resistance (132-1) and the further series resistance (132-2) are connected in series between the first port (101) and the second port (102), and wherein the further series resistance (132-2) and the adjustable shunt resistance (134) are connected in series between the second port (102) and the reference node.

3. The variable attenuator (130) according to claim 1, wherein the second semiconductor element (138) and the first semiconductor element (142-1) are controllable PIN diodes or controllable field-effect transistors (FET).

4. The variable attenuator (130) according to claim 1, wherein the series circuit of the adjustable shunt resistance (134) is configured such that a resistance adjustment range of the adjustable shunt resistance (134) is reduced as compared to a resistance adjustment range of the second semiconductor element (138) of the series circuit of the adjustable shunt resistance (134) alone.

5. The variable attenuator (130) according to claim 1, wherein the series circuit of the adjustable shunt resistance (134) is configured such that a resistance adjustment range of the adjustable shunt resistance (134) is obtained, wherein the resistance adjustment range comprises resistance values ranging from infinity to a minimum resistance value ($R_{2B}$) of the second fixed resistor (136).

6. The variable attenuator (130) according to claim 5, wherein the second fixed resistor (136) of the series circuit of the adjustable shunt resistance (134) is configured to provide the minimum resistance value ($R_{2B}$), wherein the minimum resistance value ($R_{2B}$) is determined based on a predefined maximum attenuation (max($ATT_{dB}$)) of the variable attenuator (130).

7. The variable attenuator (130) according to claim 1, wherein the adjustable resistance (134-1) and the adjustable shunt resistance (134) are configured to provide a predefined attenuation range of the variable attenuator (130), wherein the predefined attenuation range comprises attenuation values in the of 1 to 30 or 5 to 10 dB.

8. The variable attenuator (130) according to claim 1, further comprising a controller is configured to control the adjustable resistance($R_{2A}$) of the second semiconductor element (138) of the adjustable shunt resistant (134) by the second control signal ($V_2$) and to control the adjustable resistance ($R_{1A}$) of the first semiconductor element of the adjustable series resistance (132-1) by the first control signal ($V_1$).

9. A resistive attenuator structure (100), comprising:
   a source (110) for providing an RF input voltage (V1) at the first port (101);
   a load (120) coupled to the second port (102); and
   the variable attenuator (130) according to claim 1.

* * * * *